United States Patent
Hu

(10) Patent No.: US 12,409,734 B2
(45) Date of Patent: Sep. 9, 2025

(54) INSULATION FAULT RESPONSE METHOD AND APPARATUS FOR FUEL CELL VEHICLE

(71) Applicant: GREAT WALL MOTOR COMPANY LIMITED, Baoding (CN)

(72) Inventor: Zhimin Hu, Baoding (CN)

(73) Assignee: GREAT WALL MOTOR COMPANY LIMITED, Hebei (CN)

( * ) Notice: Subject to any disclaimer, the term of this patent is extended or adjusted under 35 U.S.C. 154(b) by 679 days.

(21) Appl. No.: 17/758,127

(22) PCT Filed: Apr. 1, 2021

(86) PCT No.: PCT/CN2021/084988
§ 371 (c)(1),
(2) Date: Jun. 28, 2022

(87) PCT Pub. No.: WO2021/197437
PCT Pub. Date: Oct. 7, 2021

(65) Prior Publication Data
US 2023/0044324 A1  Feb. 9, 2023

(30) Foreign Application Priority Data

Apr. 2, 2020  (CN) .......................... 202010256580.6

(51) Int. Cl.
*B60L 3/00* (2019.01)
*B60L 58/31* (2019.01)
(Continued)

(52) U.S. Cl.
CPC .......... *B60L 3/0053* (2013.01); *B60L 3/0069* (2013.01); *B60L 58/31* (2019.02); *G01R 27/025* (2013.01);
(Continued)

(58) Field of Classification Search
USPC ........................................................ 320/136
See application file for complete search history.

(56) References Cited

U.S. PATENT DOCUMENTS

2007/0013382 A1* 1/2007 Hinz ..................... B60L 3/0053
429/9
2008/0119976 A1* 5/2008 Tarchinski ........... G01R 31/007
701/31.4
(Continued)

FOREIGN PATENT DOCUMENTS

CN  101183126  5/2008
CN  107817431  3/2018
(Continued)

OTHER PUBLICATIONS

EPO, Extended European Search Report for EP Application No. 21781013.4, Dec. 22, 2022.
(Continued)

*Primary Examiner* — Bryce M Aisaka
(74) *Attorney, Agent, or Firm* — Hodgson Russ LLP

(57) ABSTRACT

An insulation fault response method for a fuel cell vehicle, comprising: when a vehicle starts, detecting whether a fuel cell is in a startup state or not; when the fuel cell is not in the startup state, reading a first insulation resistance detected by a fuel cell control unit and a second insulation resistance detected by a cell management system; when the first insulation resistance indicates that the vehicle is in an insulation fault, executing a first control policy; and when the second insulation resistance indicates that the vehicle in an insulation fault, executing a second control policy, wherein the first control policy is different from the second control policy, and wherein when the first insulation resistance is less than a first threshold and/or the second insulation resistance is less than a second threshold, the vehicle is in an insulation fault.

12 Claims, 4 Drawing Sheets

(51) Int. Cl.
  *G01R 27/02* (2006.01)
  *G01R 31/00* (2006.01)
  *G01R 31/52* (2020.01)
  *H01M 8/04537* (2016.01)

(52) U.S. Cl.
  CPC ........... *G01R 31/006* (2013.01); *G01R 31/52* (2020.01); *H01M 8/04634* (2013.01); *H01M 2250/20* (2013.01)

(56) References Cited

U.S. PATENT DOCUMENTS

| | | |
|---|---|---|
| 2010/0244850 A1 | 9/2010 | Yano et al. |
| 2014/0197683 A1 | 7/2014 | Migita et al. |
| 2017/0356951 A1 | 12/2017 | Lee et al. |
| 2020/0052313 A1 | 2/2020 | Kajiwara et al. |

FOREIGN PATENT DOCUMENTS

| | | |
|---|---|---|
| CN | 108107274 | 6/2018 |
| CN | 109895660 | 6/2019 |
| CN | 110053519 | 7/2019 |
| CN | 110315980 | 10/2019 |
| CN | 110426556 | 11/2019 |
| CN | 110696619 | 1/2020 |
| CN | 111902310 | 11/2020 |
| DE | 102019117486 | 2/2020 |
| KR | 20170119831 | 10/2017 |
| WO | 2010003367 | 1/2010 |
| WO | 2015033627 | 3/2015 |

OTHER PUBLICATIONS

CNIPA, First Office Action for CN Application No. 202010256580.6, Mar. 18, 2022.

WIPO, International Search Report for PCT/CN2021/084988, Jul. 5, 2021.

CNIPA, Second Office Action for CN Application No. 202010256580.6, Sep. 9, 2022.

* cited by examiner

INSULATION FAULT RESPONSE METHOD AND APPARATUS FOR FUEL CELL VEHICLE

CROSS-REFERENCE TO RELATED APPLICATIONS

The present application is a U.S. national stage entry of International Application No. PCT/CN2021/084988, filed Apr. 1, 2021, which claims priority to Chinese Patent Application No. 202010256580.6, filed Apr. 2, 2020, the entire disclosures of which are incorporated herein by reference.

TECHNICAL FIELD

The present disclosure relates to the technical field of vehicles, and more particularly, to an insulation fault response method and apparatus for a fuel cell vehicle.

BACKGROUND

Fuel cell automobiles are driven by a chemical reaction that converts hydrogen energy into electrical energy, and the voltage of battery packs thereof far exceeds the safe voltage that the human body can withstand. During the daily use of automobiles, the aging or the penetration of moisture of the high-voltage cable may cause the insulation resistance value between the positive and negative leads of the power battery and the automobile chassis to decrease, resulting in electrical leakage, thereby seriously endangering the personal safety of the personnel in the automobile. In order to ensure the electrical safety of the entire vehicle, an insulation detection system is usually provided in a fuel cell vehicle such that when the resistance value is lower than the safety threshold, the entire vehicle controller is reported in time for safety response. A reasonable control strategy when executing a safety response is the key to ensure the safety of the occupants.

SUMMARY

In view of this, the present disclosure is aimed at providing an insulation fault response method for a fuel cell vehicle for enabling different insulation fault responses to be executed under different circumstances.

In order to achieve the above object, the technical solutions of the present disclosure are achieved as below:

an insulation fault response method for a fuel cell vehicle, wherein the insulation fault response method for a fuel cell vehicle comprises: in a case that a vehicle starts, detecting whether a fuel cell is in a startup state or not; in the case that the fuel cell is not in the startup state, reading a first insulation resistance value detected by a fuel cell control unit and a second insulation resistance value detected by a cell management system; in the case that the first insulation resistance value indicates that the vehicle is in an insulation fault, executing a first control strategy; and in the case that the second insulation resistance value indicates that the vehicle is in an insulation fault, executing a second control strategy, wherein the first control strategy is different from the second control strategy, and wherein in the case that the first insulation resistance value is less than a first threshold and/or the second insulation resistance value is less than a second threshold, the vehicle is in an insulation fault.

Further, the first control strategy comprises: determining whether the first insulation resistance value is less than a third threshold, the third threshold being less than the first threshold; sending the first prompt in the case that the first insulation resistance value is not less than the third threshold; and in the case that the first insulation resistance value is less than the third threshold, executing one or more of the following: sending a second prompt, prohibiting the fuel cell from starting, and controlling a vehicle speed based on lithium battery electric capacity of the vehicle.

Further, the insulation fault response method for a fuel cell vehicle further comprises: in the case that the fuel cell is in the startup state, reading a third insulation resistance value detected by the cell management system; and executing the second control strategy in the case that the third insulation resistance value indicates that the vehicle is in an insulation fault, wherein the vehicle is in an insulation fault if the third insulation resistance value is less than the second threshold.

Further, the second control strategy comprises: determining whether the second insulation resistance value is less than a fourth threshold, the fourth threshold being less than the second threshold; in the case that the second insulation resistance value is not less than the fourth threshold, executing one or more of the following: sending a third prompt, and controlling the vehicle speed of the vehicle to be lower than a first preset vehicle speed; and in the case that the second insulation resistance value is less than the fourth threshold, executing one or more of the following: sending a fourth prompt, controlling the vehicle speed of the vehicle to be lower than a second preset vehicle speed, and executing high voltage power-down in the case that the vehicle speed of the vehicle is lower than a safety threshold, wherein the second preset vehicle speed is less than the first preset vehicle speed.

Further, the insulation fault response method for a fuel cell vehicle further comprises: in the case that both the first insulation resistance value and the second insulation resistance value indicate that the vehicle is in insulation fault, executing both the first control strategy and the second control strategy.

The insulation fault response method for a fuel cell vehicle according to the present disclosure has the following advantages over the prior art.

When the fuel cell of the fuel cell vehicle is not started, the fuel cell control unit detects a first insulation resistance value in the fuel cell, and the cell management system detects a second insulation resistance value of the entire vehicle except the fuel cell. If the first insulation resistance value indicates that the vehicle is in an insulation fault, a first control strategy is executed. If the second insulation resistance value indicates that the vehicle is in an insulation fault, a second control strategy different from the first control strategy is executed. In this way, it is possible to implement different control policies for different situations to ensure the safety of the personnel inside the vehicle.

Another object of the present disclosure is to propose an insulation fault response apparatus for a fuel cell vehicle for achieving different insulation fault responses to be executed under different conditions.

In order to achieve the above object, the technical solutions of the present disclosure are achieved as below:

an insulation fault response apparatus for a fuel cell vehicle, wherein the insulation fault response apparatus for a fuel cell vehicle comprises: a fuel cell state detection module for detecting whether a fuel cell is in a startup state or not in a case that a vehicle starts; a reading module for, in the case that the fuel cell is not in the startup state, reading a first insulation resistance value detected by a fuel cell control unit and a second insulation resistance value detected by a cell management system; a first execution module for, in the case that the first insulation resistance value indicates that the vehicle is in an insulation fault, executing a first control strategy; and a second execution module for, in the case that the second insulation resistance value indicates that the vehicle is in an insulation fault, executing a second control strategy, wherein the first control strategy is different from the second control strategy, and wherein in the case that the first insulation resistance value is less than a first threshold and/or the second insulation resistance value is less than a second threshold, the vehicle is in an insulation fault.

Further, the first control strategy comprises: determining whether the first insulation resistance value is less than a third threshold, the third threshold being less than the first threshold; sending the first prompt in the case that the first insulation resistance value is not less than the third threshold; and in the case that the first insulation resistance value is less than the third threshold, executing one or more of the following: sending a second prompt, prohibiting the fuel cell from starting, and controlling a vehicle speed based on lithium battery electric capacity of the vehicle.

Further, the second control strategy comprises: determining whether the second insulation resistance value is less than a fourth threshold, the fourth threshold being less than the second threshold; in the case that the second insulation resistance value is not less than the fourth threshold, executing one or more of the following: sending a third prompt, and controlling the vehicle speed of the vehicle to be lower than a first preset vehicle speed; and in the case that the second insulation resistance value is less than the fourth threshold, executing one or more of the following: sending a fourth prompt, controlling the vehicle speed of the vehicle to be lower than a second preset vehicle speed, and executing high voltage power-down in the case that the vehicle speed of the vehicle is lower than a safety threshold, wherein the second preset vehicle speed is less than the first preset vehicle speed.

Further, the first execution module executes the first control strategy and the second execution module executes the second control strategy in the case that both the first insulation resistance value and the second insulation resistance value indicate that the vehicle is in an insulation fault.

The insulation fault response apparatus for a fuel cell vehicle has the same advantages as the above-described insulation fault response method for a fuel cell vehicle with respect to the prior art, and those will not be described in detail herein.

Accordingly, embodiments of the present disclosure also provide a computer-readable storage medium, characterized by having stored thereon instructions for causing a machine to execute the insulation fault response method for a fuel cell vehicle.

Other features and advantages of the present disclosure will be described in detail in the preferred embodiments that follow.

The above description is only an overview of the technical solutions of the present disclosure. In order to understand the technical means of the present disclosure more clearly, the implementation can be made according to the contents of the description. In order to make the above and other purposes, features, and advantages of the present disclosure more obvious and easier to understand, preferred embodiments of the present disclosure are listed below.

BRIEF DESCRIPTION OF THE DRAWINGS

In order to explain the embodiments of the present disclosure or the technical solutions in the related art more clearly, a brief description will be given below with reference to the accompanying drawings which are used in the description of the embodiments or the related art; obviously, the drawings in the description below are some embodiments of the present disclosure, and for those of ordinary skills in the art, other drawings can also be obtained from these drawings without creative efforts.

The accompanying drawings constituting a part of the present disclosure are used to provide a further understanding of the present disclosure. The schematic implementation modes of the present disclosure and descriptions thereof are used to explain the present disclosure and do not constitute an improper limitation of the present disclosure. In the drawings.

DETAILED DESCRIPTION OF THE EMBODIMENTS

Figure 1:
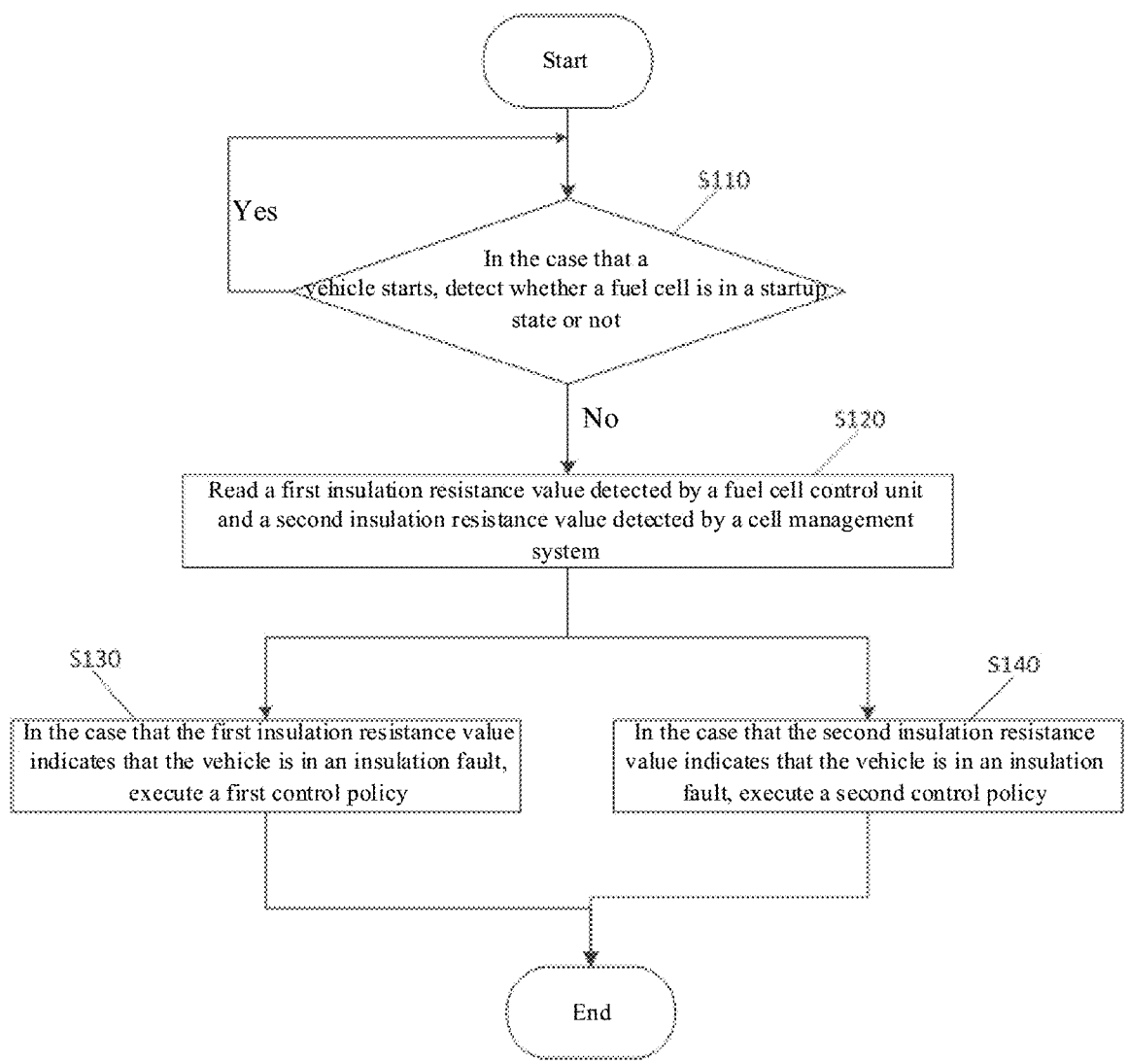
FIG. 1 shows a schematic flow diagram of an insulation fault response method for a fuel cell vehicle according to an embodiment of the present disclosure.

In order to make the purposes, technical solutions, and advantages of the embodiments of the present disclosure clearer, the technical solutions in the embodiments of the present disclosure will be clearly and completely described below with reference to the accompanying drawings in the embodiments of the present disclosure. Obviously, the described embodiments are some, but not all, of the embodiments of the present disclosure. Based on the embodiments in the present disclosure, all other embodiments obtained by a person of ordinary skills in the art without inventive efforts fall within the scope of the present disclosure.

It should be noted that implementation modes and features thereof in the present disclosure may be combined with each other without conflicts.

An insulation detection module is provided in a battery management system of a fuel cell vehicle. After a high voltage of the entire vehicle is established, the battery management system performs insulation detection on the high voltage network of the entire vehicle in real time. When it is detected that the insulation resistance value is lower than a safety threshold, the entire vehicle controller performs a safety response in time. During the running of the fuel cell vehicle, the fuel cell may be in a non-started state, in which case the fuel cell is disconnected from the high voltage network of the entire vehicle and the insulation detection is executed by using only the battery management system such that an insulation fault inside the fuel cell will not be detected.

In order to solve the above-mentioned technical problems, an insulation detection module for executing insulation detection on a fuel cell may also be provided in a fuel cell control unit. That is, two detection sources are provided in a fuel cell vehicle, the insulation resistance value of the entire vehicle is detected by a cell management system, and the insulation resistance value inside the fuel cell is detected by the fuel cell control unit. During the running of the vehicle, the fuel cell will be accessed to the high voltage network of the entire vehicle after being started, and at this time, the insulation resistance value inside the fuel cell can be detected by the cell management system; therefore, after the fuel cell is started, the cell management system is used to be responsible for executing insulation detection so as to obtain the insulation resistance value. If the fuel cell is halted or not started, the insulation resistance value is still detected by the cell management system for the entire vehicle except for the fuel cell, and the insulation resistance value inside the fuel cell is detected by the fuel cell control unit. In this way, it is possible to effectively avoid a safety risk due to an insulation fault inside the fuel cell.

In the case where the fuel cell automobile is provided with two detection sources, the insulation fault response strategy may employ a unified control strategy, i.e., the insulation resistance values detected by the fuel cell control unit and the cell management system indicate that the same response is employed when the vehicle is in an insulation fault. For example, when the insulation resistance value detected by the cell management system is too low, it indicates that the vehicle is in insulation fault, and the vehicle needs to be powered down at a low vehicle speed to protect the safety of the occupants. When the fuel cell is not started, if the fuel cell control unit detects that the insulation resistance value inside the fuel cell is too low so that the vehicle is in insulation fault, the vehicle also needs to be powered down at a low vehicle speed. However, in the case where the fuel cell is not started, even if the vehicle is in a failure response due to the insulation resistance value inside the fuel cell being too low, the occupant safety is not affected. Therefore, using a unified control strategy will likely lead to an increase in the number of the vehicle being forced to power down, thereby reducing the user experience.

The insulation fault response method and apparatus for a fuel cell vehicle provided by an embodiment of the present disclosure, in order to solve the above technical problems, realize that different insulation fault responses are executed under different circumstances, making the control strategy of the insulation fault response more reasonable. The present disclosure will now be described in detail in connection with the implementation modes with reference to the accompanying drawings.

FIG. 1 shows a schematic flow diagram of an insulation fault response method for a fuel cell vehicle according to an embodiment of the present disclosure. As shown in FIG. 1, embodiments of the present disclosure provide an insulation fault response method for a fuel cell vehicle, which may be executed, for example, by an entire vehicle controller. The method may include steps S110 to S140.

In step S110, in the case that a vehicle starts, detect whether a fuel cell is in a startup state or not.

Since the power response speed of the fuel cell is too slow to respond to the changing power demand of an automobile driver in time, most fuel cell automobiles currently adopt the parallel output mode of a fuel cell and a lithium battery. The fuel cell outputs at constant power. When the driver requests an output with a power greater than that of the fuel cell, the lithium battery is discharged, otherwise, the lithium battery is charged. When the driver power keeps the low power request for a long time and the electric capacity of the lithium battery is charged to a high threshold, the fuel cell shuts down and is disconnected from the high voltage network, and the lithium battery outputs alone. The fuel cell is started again when the electric capacity decreases. Therefore, after the vehicle is started, the fuel cell may not be in the startup state.

In the case that the vehicle starts, the fuel cell control unit may detect the state of the fuel cell in real time and output a state signal of the fuel cell to the entire vehicle controller, the state signal being capable of indicating whether the fuel cell is in a start-up state.

In step S120, in a case where the fuel cell is not in the startup state, read a first insulation resistance value detected by a fuel cell control unit and a second insulation resistance value detected by a cell management system.

In the case where the fuel cell is not in the startup state, the fuel cell control unit is responsible for detecting the insulation resistance value inside the fuel cell (i.e., the first insulation resistance value), and the cell management system is responsible for detecting the insulation resistance value of the high voltage network of the entire vehicle except the fuel cell (i.e., the second insulation resistance value).

The fuel cell control unit may transmit the detected first insulation resistance value to the entire vehicle controller to be read by the entire vehicle controller. Likewise, the cell management system may also transmit the detected second insulation resistance value to the entire vehicle controller to be read by the entire vehicle controller.

In S130, in the case that the first insulation resistance value indicates that the vehicle is in an insulation fault, execute a first control strategy.

If the first insulation resistance value is less than the first threshold, it indicates that the vehicle is in an insulation fault, and such an insulation fault is an insulation fault caused inside the fuel cell. In this case, a first control strategy may be executed. Specifically, in the case where the first insulation resistance value is less than the first threshold, it may continue to determine whether the first insulation resistance value is less than a third threshold, the third threshold being less than the first threshold. The first threshold and the third threshold may be set to any suitable values according to the actual situation.

If the first insulation resistance value is less than the first threshold but not less than the third threshold, it indicates that the current insulation fault condition is not severe. In this case, only a first prompt may be sent to alert the driver. The first prompt may be a light and/or voice prompt. For example, it can control the meter fuel cell fault light to illuminate yellow to prompt the driver, and/or control a voice player to play information about the insulation fault of the fuel cell, etc. to prompt the driver.

If the first insulation resistance value is less than the third threshold, it indicates that the current insulation fault condition is relatively severe. In this case, one or more of the following three may be executed: sending a second prompt, prohibiting the start of the fuel cell, and controlling the vehicle speed based on the lithium battery electric capacity of the vehicle. Preferably, all three of the foregoing may be implemented to ensure the safety of personnel in the vehicle.

The second prompt may be a light and/or voice prompt. For example, it can control the meter fuel cell fault light to illuminate red to prompt the driver, and/or control a voice player to play information about the severe insulation fault of the fuel cell, etc. to prompt the driver.

In the case where the fuel cell is not in the start-up state, if the insulation fault inside the fuel cell is relatively severe, the fuel cell may be prohibited from starting. For example, the entire vehicle controller may transmit a signal regarding the prohibition of starting the fuel cell to the fuel cell control unit, and the fuel cell control unit, in response to the signal, may control the fuel cell to be in a safe state to avoid the occurrence of a leakage phenomenon due to the starting of the fuel cell. Furthermore, the vehicle speed can be reasonably controlled based on the lithium battery electric capacity of the vehicle. For example, if the lithium battery electric capacity is greater than the threshold of the electric capacity, the vehicle may be controlled to run at a vehicle speed requested by the driver. If the lithium battery electric capacity is not greater than the threshold of the electric capacity, the vehicle may be controlled to decelerate or the vehicle speed of the vehicle may be controlled to not exceed a preset vehicle speed. An embodiment of the present disclosure does not limit how to reasonably control the vehicle speed according to the electric capacity of the lithium battery of the vehicle.

In S140, in the case that the second insulation resistance value indicates that the vehicle is in an insulation fault, execute a second control strategy.

If the second insulation resistance value is less than the second threshold, it indicates that the vehicle is in an insulation fault, and this insulation fault is an insulation fault caused by a portion of the entire vehicle other than the fuel cell. In this case, a second control strategy may be executed. The second control strategy is different from the first control strategy. Specifically, in the case where the second insulation resistance value is less than the second threshold, it may continue to determine whether the second insulation resistance value is less than a fourth threshold, the fourth threshold being less than the second threshold. The second threshold and the fourth threshold may be set to any suitable value according to the actual situation. In an alternative, the first threshold and the second threshold may be the same and the third threshold and the fourth threshold may be the same in an embodiment of the present disclosure. The first threshold, the second threshold, the third threshold, and the fourth threshold may be set according to the requirements for the insulation resistance value of a fuel vehicle of the national standard.

If the second insulation resistance value is less than the second threshold but not less than the fourth threshold, it indicates that the current insulation fault is not severe. In this case, one or both of the following may be executed: sending a third prompt, and controlling the vehicle speed of the vehicle to be lower than a first preset vehicle speed. Preferably, both of the foregoing may preferably be executed to ensure the safety of personnel in the vehicle.

The third prompt may be a light and/or voice prompt. For example, a fault light of an instrument power system may be controlled to illuminate yellow to prompt the driver, and/or a voice player may be controlled to play information about the insulation fault of the power system, etc. to prompt the driver. Further, the vehicle speed of the vehicle may be controlled to be lower than the first preset vehicle speed to ensure safe driving. Specifically, the current vehicle speed of the vehicle may be compared with the first preset vehicle speed. If the current vehicle speed is not less than the first preset vehicle speed, the vehicle may be controlled not to respond to the driving demand of the driver, but to decelerate until the vehicle speed is less than the first preset vehicle speed. If the current vehicle speed is less than the first preset vehicle speed, the vehicle can be controlled to run normally according to the driving demand of the driver.

If the second insulation resistance value is less than the fourth threshold, it indicates that the current insulation fault is relatively severe. In this case, any one or more of the following three may be executed: sending a fourth prompt, controlling the vehicle speed of the vehicle to be lower than a second preset vehicle speed, and executing a high voltage power-down if the vehicle speed of the vehicle is lower than a safety threshold. Preferably, all three of the foregoing may be implemented to ensure the safety of the personnel in the vehicle.

The fourth prompt may be a light and/or voice prompt. For example, a fault light of an instrument power system may be controlled to illuminate red to prompt the driver, and/or a voice player may be controlled to play information about the severe insulation fault of the power system, etc. to prompt the driver.

Further, the vehicle speed of the vehicle may be controlled to be lower than the second preset vehicle speed to ensure safe driving. Specifically, the current vehicle speed of the vehicle may be compared with the second preset vehicle speed. If the current vehicle speed is not less than the second preset vehicle speed, the vehicle may be controlled not to respond to the driving demand of the driver, but to decelerate until the vehicle speed is less than the second preset vehicle speed. If the current vehicle speed is less than the second preset vehicle speed, the vehicle can be controlled to run normally according to the driving demand of the driver. In the embodiment of the present disclosure, the second preset vehicle speed is less than the first preset vehicle speed, and the first preset vehicle speed and the second preset vehicle speed may be set to any suitable values according to actual situations. For example, the first preset vehicle speed may be 90 km/h, and the second preset vehicle speed may be 60 km/h.

Further, the entire vehicle controller may execute high voltage power-down on the vehicle when the vehicle speed of the vehicle is lower than the safety threshold. The entire vehicle controller may, for example, transmit a power-down request to a power-on and power-down control module. After receiving the power-down request, the power-on and power-down control module determines whether the current vehicle speed is lower than a safety threshold. The safety threshold is a low vehicle speed value, and is a vehicle speed required to ensure that there is no safety risk to the personnel in the vehicle when the vehicle suddenly loses power; for example, the safety threshold may be about 10 km/h, etc. If the current vehicle speed is not below the safety threshold, the vehicle is controlled to maintain the current running state. If the current vehicle speed is lower than the safety threshold, a power-down operation is executed, including cutting off the power output and the high-voltage connection, to avoid safety problems caused by the electric leakage of the power system of the entire vehicle.

Further, both the first control strategy and the second control strategy may be executed if both the first insulation resistance value and the second insulation resistance value indicate that the vehicle is in an insulation fault condition. For example, if the first insulation resistance value is less than the first threshold but not less than the third threshold, and the second insulation resistance value is less than the second threshold but not less than the fourth threshold, the entire vehicle controller may send a first prompt, send a third prompt, and control the vehicle speed of the vehicle to be lower than the first preset vehicle speed. If the first insulation resistance value is less than the first threshold but not less than the third threshold, and the second insulation resistance value is less than the fourth threshold, the entire vehicle controller may send a first prompt, send a fourth prompt, control the vehicle speed of the vehicle to be lower than the second preset vehicle speed, and execute high voltage power-down if the vehicle speed of the vehicle is lower than the safety threshold. If the first insulation resistance value is less than the third threshold, and the second insulation resistance value is less than the second threshold but not less than the fourth threshold, the entire vehicle controller may send a second prompt, prohibit the fuel cell from starting, control the vehicle speed based on the electric capacity of the lithium battery of the vehicle, send a third prompt, and control the vehicle speed of the vehicle to be lower than the first preset vehicle speed. If the first insulation resistance value is less than the third threshold and the second insulation resistance value is less than the fourth threshold, the entire vehicle controller may send a second prompt, prohibit the fuel cell from starting, control the vehicle speed based on the lithium battery electric capacity of the vehicle, send a fourth prompt, control the vehicle speed of the vehicle to be lower than a second preset vehicle speed, and execute high voltage power-down in the case that the vehicle speed of the vehicle is lower than the safety threshold. In this way, it is convenient for the driver to know that insulation faults exist in both inside of the fuel cell and the entire vehicle power system while ensuring the safety of the occupants.

Figure 2:
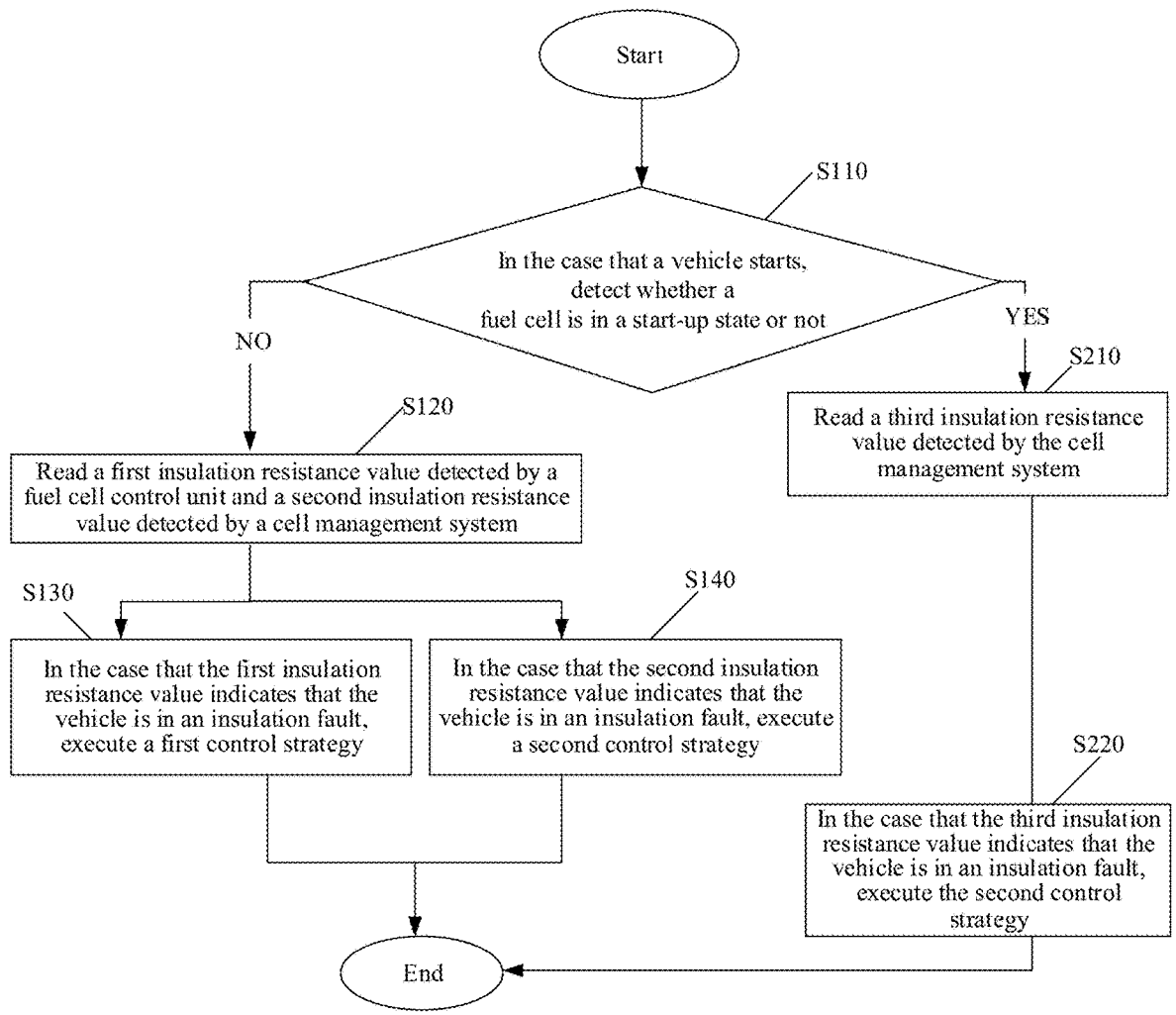
FIG. 2 shows a schematic flow diagram of an insulation fault response method for a fuel cell vehicle according to yet another embodiment of the present disclosure.

FIG. 2 shows a schematic flow diagram of an insulation fault response method for a fuel cell vehicle according to yet another embodiment of the present disclosure. As shown in FIG. 2, based on the foregoing embodiment, the insulation fault response method for a fuel cell vehicle provided by the embodiments of the present disclosure may further include steps S210 to S220.

In step S210, in a case where the fuel cell is in the startup state, read the third insulation resistance value detected by the cell management system.

In the case where the fuel cell is in the startup state, the fuel cell will be connected to the high voltage circuit of the entire vehicle, and at this time, the insulation resistance value inside the fuel cell can be detected by the cell management system; therefore, after the fuel cell is started, it is sufficient to use the cell management system to be responsible for detecting the insulation resistance value.

In step S220, in the case that the third insulation resistance value indicates that the vehicle is in an insulation fault, execute a second control strategy.

If the third insulation resistance value is less than the second threshold, it indicates that the vehicle is in insulation fault. Since the third insulation resistance value is detected by the cell management system, it cannot be determined whether the insulation fault at this time is caused by the insulation cell or other portions. In order to ensure the safety of the occupants, a second control strategy for insulation fault of the entire vehicle power system may be executed.

Specifically, in the case where the third insulation resistance value is less than the second threshold, it may continue to determine whether the third insulation resistance value is less than a fourth threshold, the fourth threshold being less than the second threshold. The second threshold and the fourth threshold may be set to any suitable value according to the actual situation. As previously described, optionally, the first threshold and second threshold may be the same and the third threshold and the fourth threshold may be the same in an embodiment of the present disclosure. The first threshold, the second threshold, the third threshold, and the fourth threshold may be set according to the requirements for the insulation resistance value of a fuel vehicle of the national standard.

If the third insulation resistance value is less than the second threshold but not less than the fourth threshold, it indicates that the current insulation fault is not severe. In this case, one or both of the following may be executed: sending a third prompt, and controlling the vehicle speed of the vehicle to be lower than a first preset vehicle speed. Preferably, both of the foregoing may preferably be executed to ensure the safety of personnel in the vehicle.

The third prompt may be a light and/or voice prompt. For example, a fault light of an instrument power system may be controlled to illuminate yellow to prompt the driver, and/or a voice player may be controlled to play information about the insulation fault of the power system, etc. to prompt the driver. Further, the vehicle speed of the vehicle may be controlled to be lower than the first preset vehicle speed to ensure safe driving. Specifically, the current vehicle speed of the vehicle may be compared with the first preset vehicle speed. If the current vehicle speed is not less than the first preset vehicle speed, the vehicle may be controlled not to respond to the driving demand of the driver, but to decelerate until the vehicle speed is less than the first preset vehicle speed. If the current vehicle speed is less than the first preset vehicle speed, the vehicle can be controlled to run normally according to the driving demand of the driver.

If the third insulation resistance value is less than the fourth threshold, it indicates that the current insulation fault is relatively severe. In this case, any one or more of the following three may be executed: sending a fourth prompt, controlling the vehicle speed of the vehicle to be lower than a second preset vehicle speed, and executing a high voltage power-down if the vehicle speed of the vehicle is lower than a safety threshold. Preferably, all three of the foregoing may be implemented to ensure the safety of personnel in the vehicle.

The fourth prompt may be a light and/or voice prompt. For example, a fault light of an instrument power system may be controlled to illuminate red to prompt the driver, and/or a voice player may be controlled to play information about the severe insulation fault of the power system, etc. to prompt the driver.

Further, the vehicle speed of the vehicle may be controlled to be lower than the second preset vehicle speed to ensure safe driving. Specifically, the current vehicle speed of the vehicle may be compared with the second preset vehicle speed. If the current vehicle speed is not less than the second preset vehicle speed, the vehicle may be controlled not to respond to the driving demand of the driver, but to decelerate until the vehicle speed is less than the second preset vehicle speed. If the current vehicle speed is less than the second preset vehicle speed, the vehicle can be controlled to run normally according to the driving demand of the driver. In the embodiment of the present disclosure, the second preset vehicle speed is less than the first preset vehicle speed, and the first preset vehicle speed and the second preset vehicle speed may be set to any suitable values according to actual situations. For example, the first preset vehicle speed may be 90 km/h, and the second preset vehicle speed may be 60 km/h.

Further, the entire vehicle controller may execute high voltage power-down on the vehicle when the vehicle speed of the vehicle is lower than the safety threshold. The entire vehicle controller may, for example, transmit a power-down request to a power-on and power-down control module.

After receiving the power-down request, the power-on and power-down control module determines whether the current vehicle speed is lower than a safety threshold. The safety threshold is a low vehicle speed value, and is a vehicle speed required to ensure that there is no safety risk to the personnel in the vehicle when the vehicle suddenly loses power; for example, the safety threshold may be about 10 km/h, etc. If the current vehicle speed is not below the safety threshold, the vehicle is controlled to maintain the current running state. If the current vehicle speed is lower than the safety threshold, a power-down operation is executed, including cutting off the power output and the high-voltage connection, to avoid safety problems caused by the electric leakage of the power system of the entire vehicle.

According to the insulation fault response method for a fuel cell vehicle provided by the embodiments of the present disclosure, different control policies are executed for the insulation fault conditions occurring in the case where the fuel cell is started and the case where the fuel cell is not started, thereby ensuring the safety of the occupants without affecting the running of the vehicle as much as possible, while reducing the number of power-downs due to the insulation fault, and thus improving the user experience.

Figure 3:
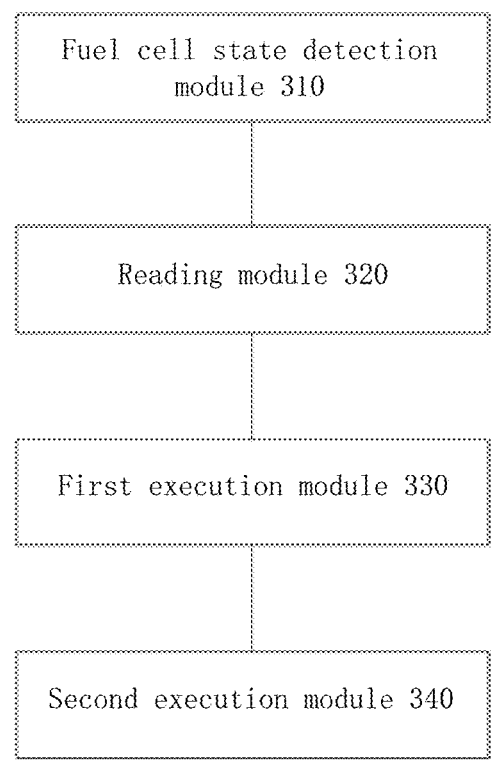
FIG. 3 is a block diagram showing the structure of an insulation fault response apparatus for a fuel cell vehicle according to yet another embodiment of the present disclosure.

FIG. 3 is a block diagram showing the structure of an insulation fault response apparatus for a fuel cell vehicle according to yet another embodiment of the present disclosure. As shown in FIG. 3, an embodiment of the present disclosure also provides an insulation fault response apparatus for a fuel cell vehicle. The apparatus may be applied to an entire vehicle controller. The apparatus may include: a fuel cell state detection module 310 for detecting whether a fuel cell is in a startup state or not in the case that a vehicle starts; a reading module 320 for, in the case that the fuel cell is not in the startup state, reading a first insulation resistance value detected by a fuel cell control unit and a second insulation resistance value detected by a cell management system; a first execution module 330 for, in the case that the first insulation resistance value indicates that the vehicle is in an insulation fault, executing a first control strategy; and a second execution module 340 for, in the case that the second insulation resistance value indicates that the vehicle is in an insulation fault, executing a second control strategy, wherein the first control strategy is different from the second control strategy, and wherein in the case that the first insulation resistance value is less than a first threshold and/or the second insulation resistance value is less than a second threshold, the vehicle is in an insulation fault. Here, specific execution processes of the first execution strategy and the second execution strategy may be referred to the foregoing, and will not be described in detail herein.

In some alternative embodiments, the first execution module 330 executes the first control strategy and the second execution module 340 executes the second control strategy in the case that both the first insulation resistance value and the second insulation resistance value indicate that the vehicle is in an insulation fault.

In some alternative embodiments, the reading module 320 may also be used for, in the case that the fuel cell is in the startup state, reading the third insulation resistance value detected by the cell management system. The second execution module 340 may also be used for executing the second control strategy in the case that the third insulation resistance value indicates that the vehicle is in an insulation fault, wherein the vehicle is in an insulation fault if the third insulation resistance value is less than the second threshold.

According to the insulation fault response apparatus for a fuel cell vehicle provided by the present disclosure, different control policies are executed for the insulation fault conditions occurring in the case where the fuel cell is started and the case where the fuel cell is not started, thereby ensuring the safety of the occupants without affecting the running of the vehicle as much as possible, while reducing the number of power-downs due to the insulation fault, and thus improving the user experience.

The specific working principles and benefits of the insulation fault response apparatus for a fuel cell vehicle provided by the embodiments of the present disclosure are the same as those of the insulation fault response method for a fuel cell vehicle provided by the embodiments of the present disclosure described above, and will not be described in detail herein.

Correspondingly, embodiments of the present disclosure also provide a computer-readable storage medium including a memory having stored thereon instructions for enabling a machine to execute the insulation fault response method for a fuel cell vehicle according to any of the embodiments of the present disclosure. Wherein the computer-readable storage medium includes, but is not limited to, phase-change random access memory (PRAM), static random access memory (SRAM), dynamic random access memory (DRAM), other types of random access memory (RAM), read-only memory (ROM), electrically erasable programmable read-only memory (EEPROM), flash memory (Flash Memory) or other memory technologies, compact disc read-only memory (CD-ROM), digital versatile disc (DVD) or other optical storage, magnetic cassettes, tape and disk storage, or other magnetic storage devices, and like various media that can store program codes.

The embodiments of the apparatus described above are merely schematic, wherein the units illustrated as separate parts may or may not be physically separated, and the parts shown as units may or may not be physical units, i.e., they may be located in one place, or may also be distributed over a plurality of network units. Some or all of the modules may be selected to achieve the objects of the embodiment schemes according to actual needs. A person of ordinary skills in the art could understand and implement the present disclosure without involving any inventive efforts.

Various part embodiments of the present disclosure may be implemented in hardware, or in a software module running on one or more processors, or in a combination thereof. Those skilled in the art will appreciate that a microprocessor or digital signal processor (DSP) may be used in practice to implement some or all of the functions of some or all of the parts of a computing processing device according to the embodiments of the present disclosure. The present disclosure may also be embodied as a device or an apparatus program (e.g., a computer program and a computer program product) for executing a portion or all of the methods described herein. Such a program implementing the present disclosure may be stored on a computer-readable medium or may be in the form of one or more signals. Such signals may be downloaded from an Internet website, provided on a carrier signal, or provided in any other form.

Figure 4:
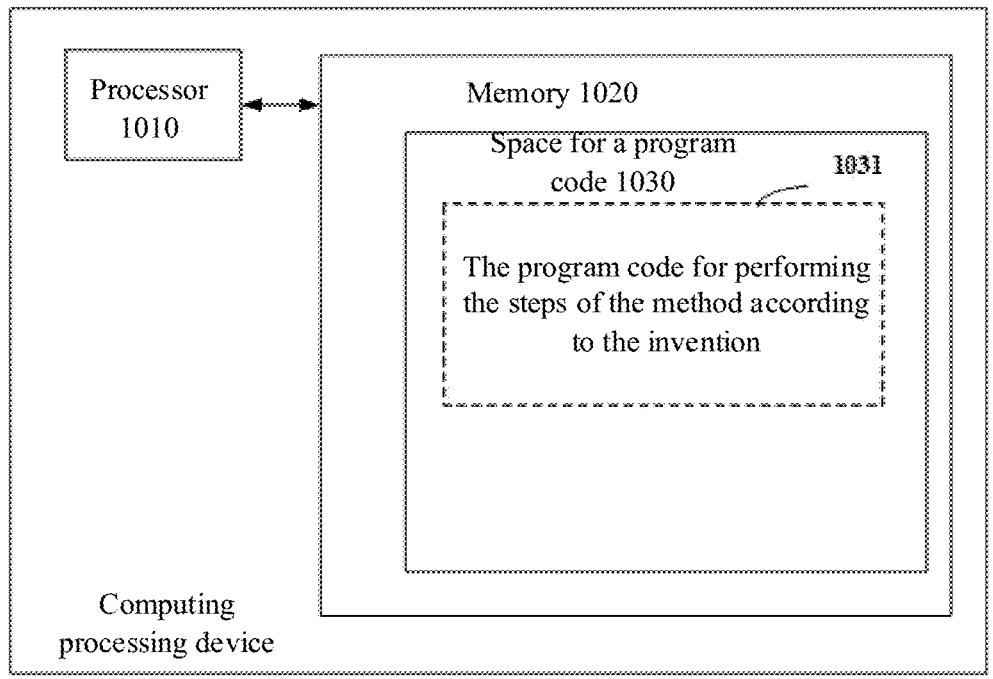
FIG. 4 schematically shows a block diagram of a computing processing device for executing a method according to the present disclosure.
Figure 5:
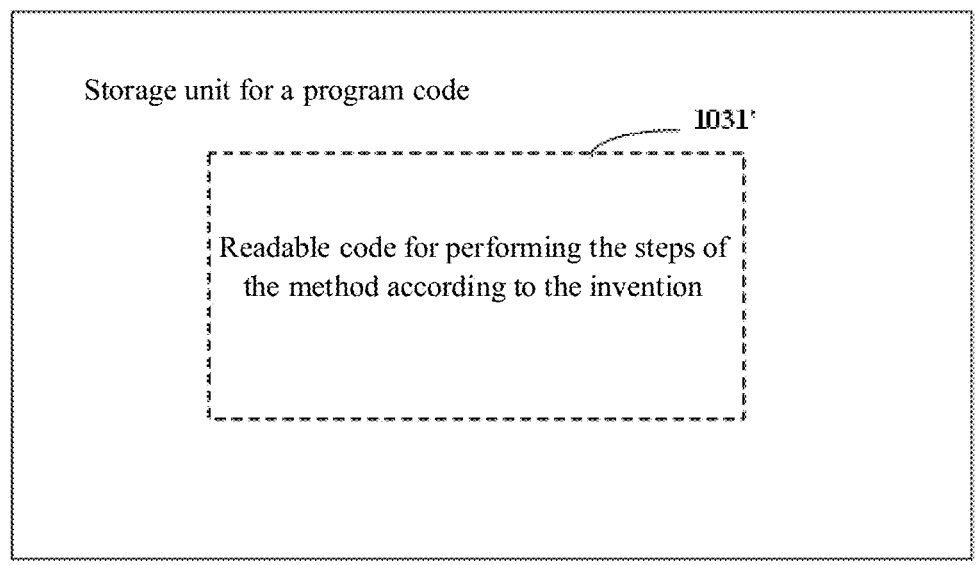
FIG. 5 schematically shows a storage unit for holding or carrying a program code for implementing the method according to the present disclosure.

For example, FIG. 4 shows a computing processing device that may implement a method according to the present disclosure. The computing processing device conventionally includes a processor 1010 and a computer program product or computer-readable medium in the form of a memory 1020. The memory 1020 may be an electronic memory such as flash memory, EEPROM (electrically erasable programmable read-only memory), EPROM, hard disk, or ROM. The memory 1020 has a storage space 1030 for a program code 1031 for executing any of the method steps of the above method. For example, the storage space 1030 for the program code may include each program code 1031 for implementing various steps in the above method, respectively. The program codes may be read from or written into one or more computer program products. These computer program products comprise a program code carrier such as a hard disk, a compact disc (CD), a memory card, or a floppy disk. Such a computer program product is usually a portable or fixed storage unit as described with reference to FIG. 5. The storage unit may have storage segments, storage space, etc. arranged similarly to the memory 1020 in the computing processing device of FIG. 4. The program code may, for example, be compressed in a suitable form. Generally, the storage unit includes a computer-readable code 1031', i.e., a code that can be read by a processor, such as, for example, 1010. These codes, when run by a computing processing device, cause the computing processing device to execute the various steps in the method described above.

Reference herein to "one embodiment", "an embodiment", or "one or more embodiments" means that a particular feature, structure, or characteristic described in connection with the embodiment is included in at least one embodiment of the present disclosure. In addition, please note that instances of the phrase "in one embodiment" herein are not necessarily all referring to the same embodiment.

In the description provided herein, numerous specific details are set forth. However, it could be understood that embodiments of the disclosure may be practiced without these specific details. In some instances, well-known methods, structures and techniques have not been shown in detail in order not to obscure the understanding of this description.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosure can be implemented by means of hardware comprising several distinct elements, and by means of a suitably programmed computer. In the unit claims enumerating several apparatuses, several of these apparatuses can be specifically embodied by one and the same item of hardware. The use of the words first, second, third, etc. does not denote any order. These words may be interpreted as names.

The above descriptions are only preferred embodiments of the present disclosure, and are not intended to limit the present disclosure. Any modifications, equivalent replacements, improvements, etc. made within the spirit and principles of the present disclosure shall be included in the scope of the present disclosure.

The invention claimed is:

1. An insulation fault response method for a fuel cell vehicle, wherein the insulation fault response method for a fuel cell vehicle comprises:
   by one or more processors, when a vehicle starts, detecting whether a fuel cell is in a startup state or not;
   by one or more processors, when the fuel cell is not in the startup state, reading a first insulation resistance value detected by a fuel cell control unit and a second insulation resistance value detected by a cell management system;
   by one or more processors, when the first insulation resistance value indicates that the vehicle is in an insulation fault, executing a first control strategy; and
   by one or more processors, when the second insulation resistance value indicates that the vehicle is in an insulation fault, executing a second control strategy, by one or more processors, wherein the first control strategy is different from the second control strategy, and wherein when the first insulation resistance value is less than a first threshold and/or the second insulation resistance value is less than a second threshold, the vehicle is in an insulation fault;
   wherein the first control strategy comprises:
      determining whether the first insulation resistance value is less than a third threshold, the third threshold being less than the first threshold;
      sending a first prompt when the first insulation resistance value is not less than the third threshold; and
      when the first insulation resistance value is less than the third threshold, executing one or more of the following: sending a second prompt, prohibiting the fuel cell from starting, and controlling a vehicle speed based on lithium battery electric capacity of the vehicle.

2. The insulation fault response method for the fuel cell vehicle according to claim 1, wherein the insulation fault response method for the fuel cell vehicle further comprises:
   when the fuel cell is in the startup state, reading a third insulation resistance value detected by the cell management system; and
   when the third insulation resistance value indicates that the vehicle is in an insulation fault, executing the second control strategy,
   wherein the vehicle is in an insulation fault when the third insulation resistance value is less than the second threshold.

3. The insulation fault response method for a fuel cell vehicle according to claim 1, wherein the second control strategy comprises:
   determining whether the second insulation resistance value is less than a fourth threshold, the fourth threshold is less than the second threshold;
   when the second insulation resistance value is not less than the fourth threshold, executing one or more of the following: sending a third prompt, and controlling the vehicle speed of the vehicle to be lower than a first preset vehicle speed; and
   when the second insulation resistance value is less than the fourth threshold, executing one or more of the following: sending a fourth prompt, controlling the vehicle speed of the vehicle to be lower than a second preset vehicle speed, and executing high voltage power-down when the vehicle speed of the vehicle is lower than a safety threshold,
   wherein the second preset vehicle speed is less than the first preset vehicle speed.

4. The insulation fault response method for the fuel cell vehicle according to claim 1, wherein the insulation fault response method for the fuel cell vehicle further comprises:
   when both the first insulation resistance value and the second insulation resistance value indicate that the vehicle is in insulation fault, executing both the first control strategy and the second control strategy.

5. A non-transitory computer-readable storage medium, wherein the non-transitory computer-readable storage medium stores thereon instructions for causing a computer to execute the insulation fault response method for the fuel cell vehicle according to claim 1.

6. An insulation fault response system for the fuel cell vehicle, wherein the insulation fault response system for the fuel cell vehicle comprises:
  one or more processors and a storage apparatus; and
  the storage apparatus stores a computer program which, when executed by the processor, performs the operations comprising:
    detecting whether a fuel cell is in a startup state or not when a vehicle starts;
    when the fuel cell is not in the startup state, reading a first insulation resistance value detected by a fuel cell control unit and a second insulation resistance value detected by a cell management system;
    when the first insulation resistance value indicates that the vehicle is in an insulation fault, executing a first control strategy; and
    when the second insulation resistance value indicates that the vehicle is in an insulation fault, executing a second control strategy;
  wherein the first control strategy is different from the second control strategy, and wherein when the first insulation resistance value is less than a first threshold and/or the second insulation resistance value is less than a second threshold, the vehicle is in an insulation fault;
  wherein the operations of the system comprise:
    determining whether the first insulation resistance value is less than a third threshold, the third threshold being less than the first threshold;
    sending a first prompt when the first insulation resistance value is not less than the third threshold; and
    when the first insulation resistance value is less than the third threshold, executing one or more of the following: sending a second prompt, prohibiting the fuel cell from starting, and controlling a vehicle speed based on lithium battery electric capacity of the vehicle.

7. The insulation fault response system for a fuel cell vehicle according to claim 6, wherein the operations of the system comprise:
  determining whether the second insulation resistance value is less than a fourth threshold, the fourth threshold is less than the second threshold;
  when the second insulation resistance value is not less than the fourth threshold, executing one or more of the following: sending a third prompt, and controlling the vehicle speed of the vehicle to be lower than a first preset vehicle speed; and
  when the second insulation resistance value is less than the fourth threshold, executing one or more of the following: sending a fourth prompt, controlling the vehicle speed of the vehicle to be lower than a second preset vehicle speed, and executing high voltage power-down when the vehicle speed of the vehicle is lower than a safety threshold,
  wherein the second preset vehicle speed is less than the first preset vehicle speed.

8. The insulation fault response system for a fuel cell vehicle according to claim 6, wherein the operation executes the first control strategy and the second control strategy when both the first insulation resistance value and the second insulation resistance value indicate that the vehicle is in an insulation fault.

9. A computing processing device, comprising:
  a memory storing a computer-readable code; and
  one or more processors, wherein when the computer-readable code is executed by the one or more processors, the computing processing device executes an insulation fault response method for the fuel cell vehicle, wherein the insulation fault response method for a fuel cell vehicle comprises:
    when a vehicle starts, detecting whether a fuel cell is in a startup state or not;
    when the fuel cell is not in the startup state, reading a first insulation resistance value detected by a fuel cell control unit and a second insulation resistance value detected by a cell management system;
    when the first insulation resistance value indicates that the vehicle is in an insulation fault, executing a first control strategy; and
    when the second insulation resistance value indicates that the vehicle is in an insulation fault, executing a second control strategy,
  wherein the first control strategy is different from the second control strategy, and wherein when the first insulation resistance value is less than a first threshold and/or the second insulation resistance value is less than a second threshold, the vehicle is in an insulation fault;
  wherein the first control strategy comprises:
    determining whether the first insulation resistance value is less than a third threshold, the third threshold being less than the first threshold;
    sending a first prompt when the first insulation resistance value is not less than the third threshold; and
    when the first insulation resistance value is less than the third threshold, executing one or more of the following: sending a second prompt, prohibiting the fuel cell from starting, and controlling a vehicle speed based on lithium battery electric capacity of the vehicle.

10. The device according to claim 9, wherein the insulation fault response method for the fuel cell vehicle further comprises:
  when the fuel cell is in the startup state, reading a third insulation resistance value detected by the cell management system; and
  when the third insulation resistance value indicates that the vehicle is in an insulation fault, executing the second control strategy,
  wherein the vehicle is in an insulation fault when the third insulation resistance value is less than the second threshold.

11. The device according to claim 9, wherein the second control strategy comprises:
  determining whether the second insulation resistance value is less than a fourth threshold, the fourth threshold is less than the second threshold;
  when the second insulation resistance value is not less than the fourth threshold, executing one or more of the following: sending a third prompt, and controlling the vehicle speed of the vehicle to be lower than a first preset vehicle speed; and
  when the second insulation resistance value is less than the fourth threshold, executing one or more of the following: sending a fourth prompt, controlling the vehicle speed of the vehicle to be lower than a second preset vehicle speed, and executing high voltage power-down when the vehicle speed of the vehicle is lower than a safety threshold,
  wherein the second preset vehicle speed is less than the first preset vehicle speed.

12. The device according to claim 9, wherein the insulation fault response method for the fuel cell vehicle further comprises:

when both the first insulation resistance value and the second insulation resistance value indicate that the vehicle is in insulation fault, executing both the first control strategy and the second control strategy.

\* \* \* \* \*